United States Patent
Myers et al.

(10) Patent No.: US 7,608,924 B2
(45) Date of Patent: Oct. 27, 2009

(54) LIQUID COOLED POWER ELECTRONIC CIRCUIT COMPRISING STACKED DIRECT DIE COOLED PACKAGES

(75) Inventors: Bruce A. Myers, Kokomo, IN (US); Joseph M. Ratell, Indianapolis, IN (US)

(73) Assignee: Delphi Technologies, Inc., Troy, MI (US)

( * ) Notice: Subject to any disclaimer, the term of this patent is extended or adjusted under 35 U.S.C. 154(b) by 12 days.

(21) Appl. No.: 11/800,003

(22) Filed: May 3, 2007

(65) Prior Publication Data
US 2008/0272485 A1 Nov. 6, 2008

(51) Int. Cl.
*H01L 23/473* (2006.01)

(52) U.S. Cl. .............. 257/714; 257/E23.098; 257/E25.013; 257/728; 257/686; 257/777; 257/723; 257/712; 257/713; 257/717; 257/720; 257/675

(58) Field of Classification Search ........... 257/714, 257/675, E23.098, E25.013, 678, 728, 686, 257/685, 723, 724, 725, 777, 717, 720, 712, 257/713
See application file for complete search history.

(56) References Cited

U.S. PATENT DOCUMENTS

| 5,633,530 | A | * | 5/1997 | Hsu ........................... 257/685 |
| 6,717,812 | B1 | * | 4/2004 | Pinjala et al. ............... 361/699 |
| 2005/0067694 | A1 | * | 3/2005 | Pon et al. ..................... 257/723 |
| 2006/0022334 | A1 | * | 2/2006 | Myers et al. ................. 257/724 |
| 2006/0034052 | A1 | * | 2/2006 | Chang et al. ................ 361/697 |
| 2006/0291164 | A1 | * | 12/2006 | Myers et al. ................. 361/699 |
| 2007/0063337 | A1 | * | 3/2007 | Schubert et al. ............. 257/714 |
| 2008/0272484 | A1 | * | 11/2008 | Myers et al. ................. 257/714 |

FOREIGN PATENT DOCUMENTS

EP 1 708 322 10/2006
WO 2006/056199 6/2006

OTHER PUBLICATIONS

European Search Report dated Oct. 29, 2008.

* cited by examiner

*Primary Examiner*—Alexander O Williams
(74) *Attorney, Agent, or Firm*—Jimmy L. Funke

(57) ABSTRACT

A plurality of direct die cooled semiconductor power device packages are vertically stacked with both coolant and electrical interfacing to form a liquid cooled power electronic circuit. The packages are individually identical, and selectively oriented prior to stacking in order to form the desired circuit connections and laterally stagger the package leads.

12 Claims, 7 Drawing Sheets

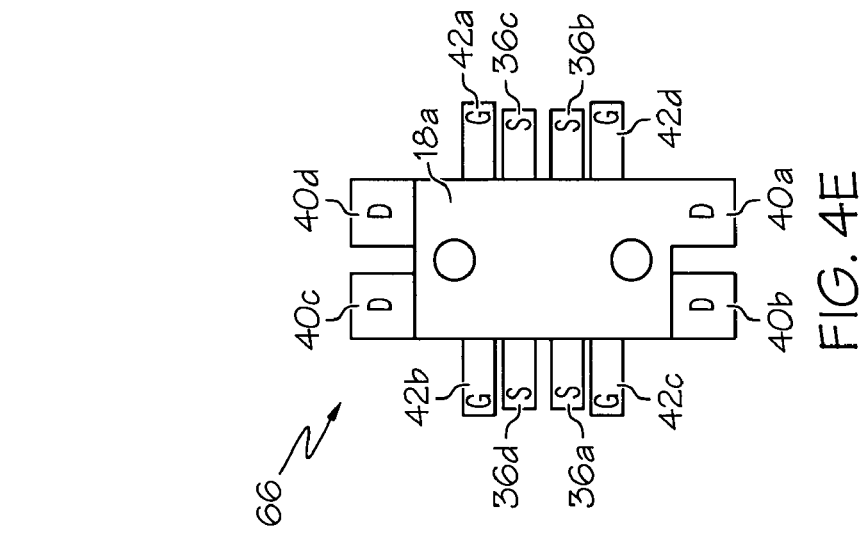
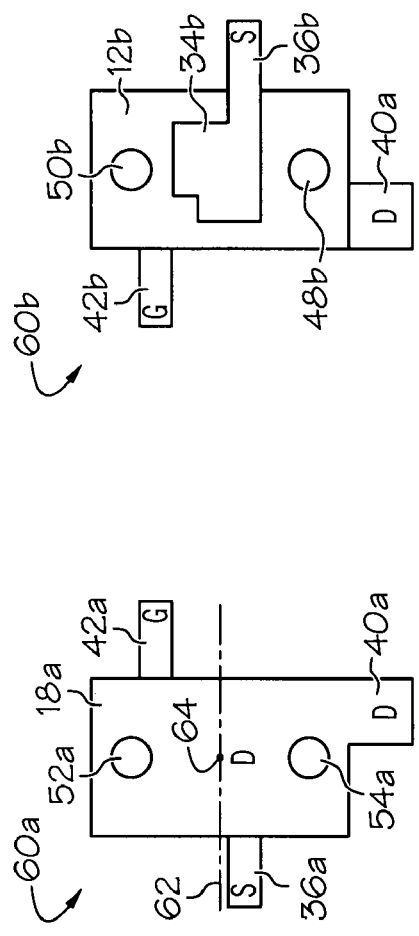
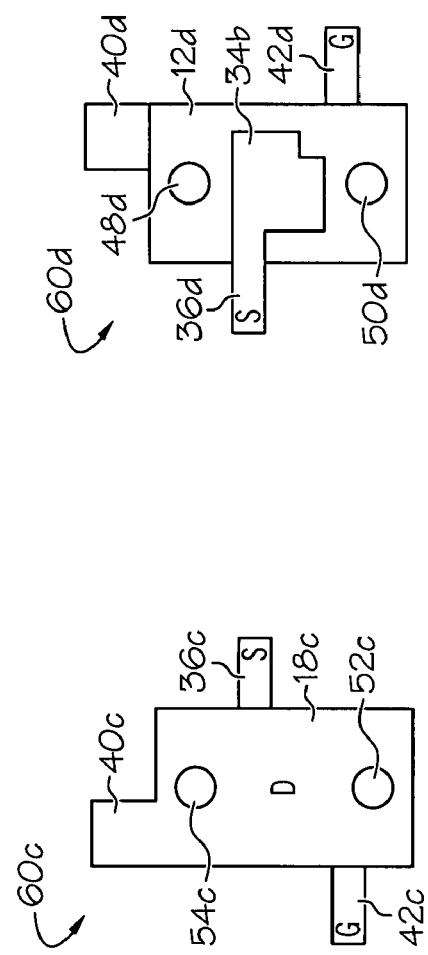

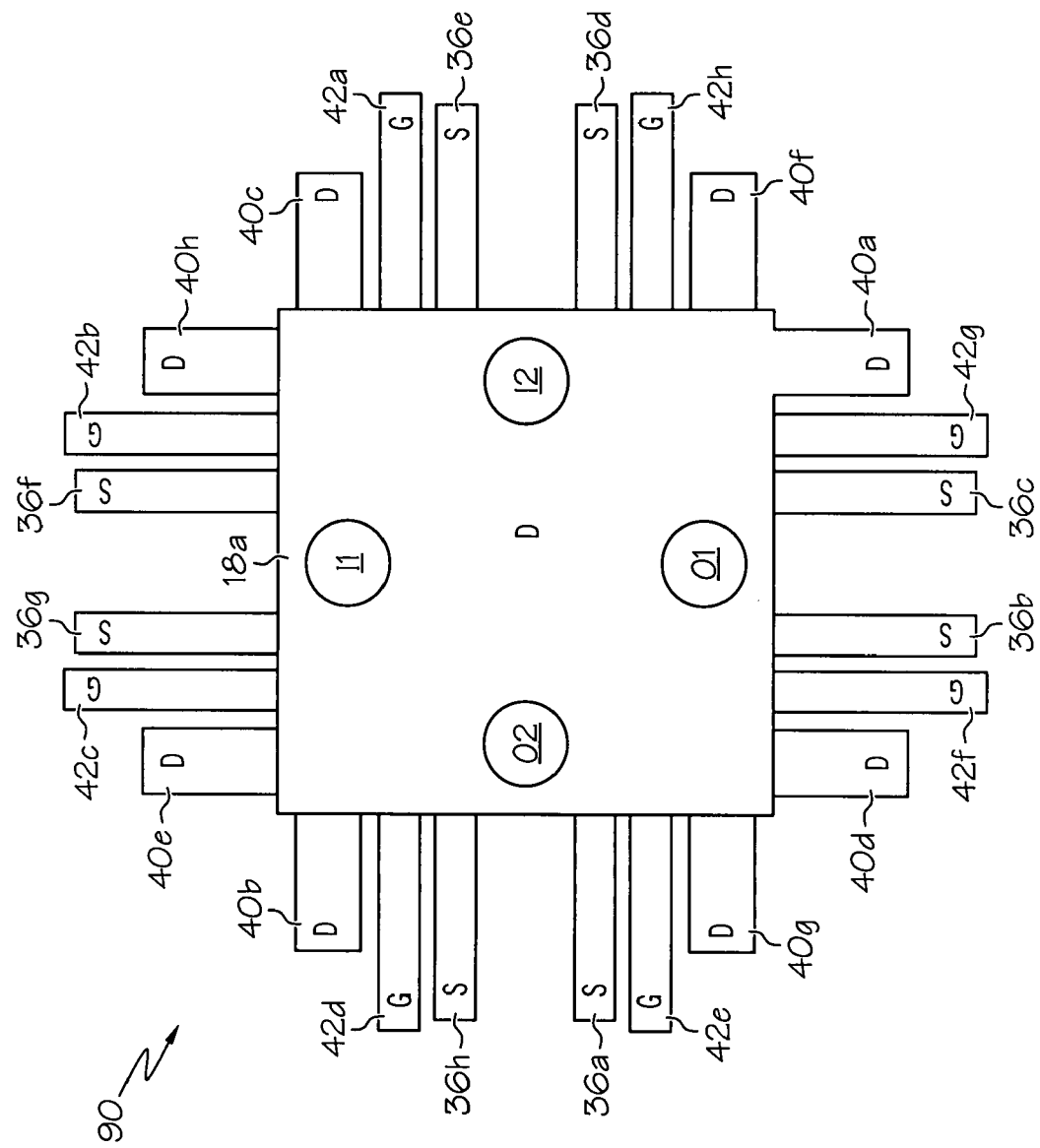

LIQUID COOLED POWER ELECTRONIC CIRCUIT COMPRISING STACKED DIRECT DIE COOLED PACKAGES

TECHNICAL FIELD

The present invention relates to liquid cooling of power semiconductor electronics, and more particularly to a liquid cooled power electronic circuit defined by a stack of electrically interconnected integrated circuit chip packages.

BACKGROUND OF THE INVENTION

Various types of cooling mechanisms can be used to remove waste heat from high power semiconductor devices such as power FETs and IGBTs. In cases where the waste heat and/or the ambient temperature are very high, the power device packages can be mounted on a liquid-cooled heat exchanger or a cold plate through which liquid coolant is circulated. The heat transfer can be significantly improved by bringing the liquid coolant directly into contact with the semiconductor chip (die), as shown in the Patent Application Publication Nos. 2006/0022334; 2006/0034052; 2006/0291164; and 2007/0063337, all assigned to Delphi Technologies, Inc. As described in these patent documents, a major surface of the semiconductor chip (say, the drain terminal of a power FET) can be undercut to define an array of fluid conducting channels through the bulk region of the chip, and the chip can be packaged so that some or all of the circulating fluid flows through the channels to remove heat from the chip. As described in the aforementioned Publication No. 2006/0022334, the direct die cooling approach can be implemented on a modular or stand-alone basis by packaging a channeled semiconductor chip in a fluid chamber of a molded housing, and mounting the housing on a circuit board with both electrical and fluid interconnects.

SUMMARY OF THE INVENTION

The present invention is directed to an improved direct die cooling arrangement in which a plurality of liquid cooled semiconductor power device packages with direct die cooling are vertically stacked with both coolant and electrical interfacing to form a liquid cooled power electronic circuit. Preferably, the packages are individually identical, and selectively oriented prior to stacking in order to form the desired circuit connections and laterally stagger the package leads.

BRIEF DESCRIPTION OF THE DRAWINGS

FIGS. 4A-4D depict four different orientations of the transistor package of FIG. 2B. FIG. 4A depicts a base orientation, FIG. 4B depicts a flipped orientation, FIG. 4C depicts a rotated orientation, and FIG. 4D depicts a flipped and rotated orientation.

FIG. 4E depicts a vertically stacked assembly of the transistor packages of FIGS. 4A-4D.

FIG. 7C depicts a vertically stacked assembly of transistor packages of the type shown in FIG. 7B.

DESCRIPTION OF THE PREFERRED EMBODIMENT

In general, the present invention is directed to a semiconductor packaging approach in which a plurality of liquid cooled semiconductor power device packages incorporating direct die cooling are vertically stacked to form a liquid cooled power electronic circuit. The invention is disclosed in the context of power field-effect transistors (FETs) configured to form an H-bridge or ½-H-Bridge power transistor circuit, but it will be recognized that the disclosed approach equally applies to other semiconductor power devices and other power electronic circuits. FIGS. 1, 2A-2B, 3 and 4A-4E illustrate a first embodiment of a liquid cooled power transistor package incorporating direct die cooling. FIGS. 5A-5B and 6A-6B respectively illustrate how the transistor packages of FIGS. 1, 2A-2B, 3 and 4A-4E can be stacked to form H-Bridge and ½-H-Bridge transistor circuits. And FIGS. 7A-7C illustrate a second embodiment of a liquid cooled power transistor package incorporating direct die cooling.

Figure 1:
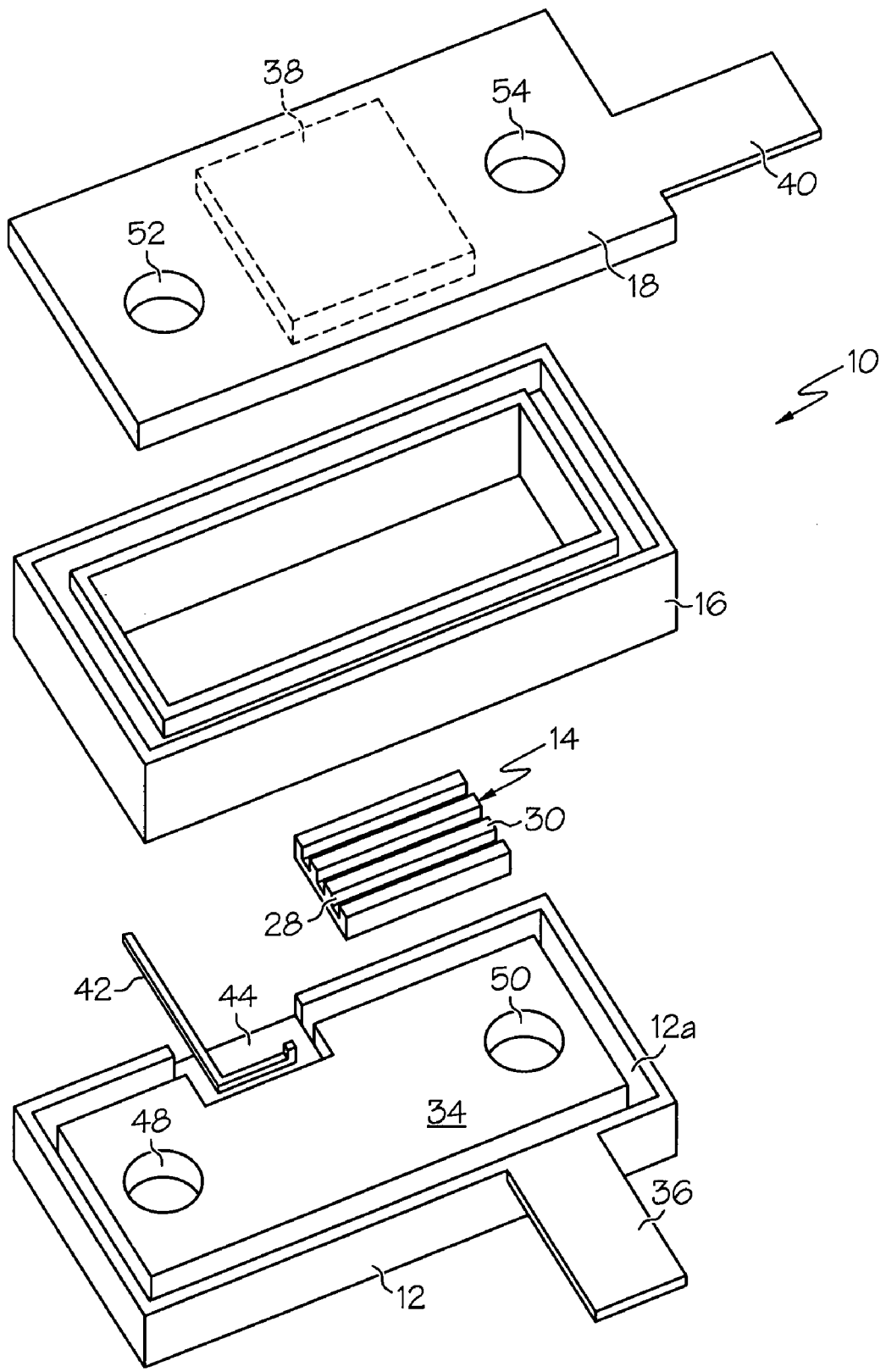
FIG. 1 is an exploded isometric diagram of a liquid cooled transistor package with direct die cooling according to the present invention.

Referring to FIGS. 1, 2A-2B and 3, but particularly to FIG. 1, the reference numeral 10 generally designates a first embodiment of a liquid cooled power transistor package with direct die cooling. The package 10 includes a metal base 12 having a low coefficient of thermal expansion (CTE), a power FET chip 14, an insulative frame 16, and a metal cover 18.

The FET 14 has a lower major surface on which are formed two solderable terminals 22 and 24, with the terminal 22 being internally connected to the FET source and the terminal 24 being internally connected to the FET gate. The upper major surface of FET 14 is partially recessed by an etching or sawing process to define a number of parallel channels 28 separated by intervening walls 30; solderable terminals 32 formed on the upper wall surfaces are internally connected to the FET drain. The source terminal 22 of FET 14 is soldered to a mounting platform 34 of metal base 12, and a metal tab 36 extending laterally from base 12 defines the source lead of package 10. The drain terminals 32 of FET 14 are soldered to a contact pedestal 38 formed on the inboard face of metal cover 18, and a metal tab 40 extending laterally from cover 18 defines the drain lead of package 10. The gate terminal 24 is soldered to a gate lead 42 that is partially recessed in an insulated pad 44 formed on the periphery of metal base 12. The inboard end of the gate lead 42 is up-turned as shown to be co-planar with the mounting platform 34 of metal base 12. Of course, the FET terminals 22, 24 and 32 can be attached to the mounting platform 34, gate lead 42 and contact pedestal 38 with conductive adhesive instead of solder, if desired. In either case, the solder or conductive adhesive serves to both electrically and mechanically secure the FET 14 in the package 10.

Frame 16 is sandwiched between base 12 and cover 18 to form a sealed chamber 46. The frame 16 may comprise a thermo-set molding compound that is insert-molded on the base 12, or may be molded as a separate item and then secured to the base 12 by an adhesive dispensed into a peripheral channel 12a formed on the inboard face of base 12. The inboard face of cover 18 has a peripheral rib (not shown) that nests in a channel formed in the upper face of frame 16, and is secured to frame 16 by an adhesive dispensed into the channel. Alternately, the frame 16 can be formed of ceramic material with metalized lower and upper faces for solder attachment to base 12 and cover 18 in order to more closely match the frame's CTE with the CTE of base 12 and cover 18; in this case, gate lead 42 would be insulated and partially buried in base 12.

Two coolant passages 48 and 50 are formed in opposite ends of the base 12 within the walls of frame 16 to admit and exhaust liquid coolant. The liquid coolant enters chamber 46 through one of the passages 48, 50, flows through the channels 28 of FET 14, and exits chamber 46 through the other passage 50, 48. The passages 48 and 50 are identical in size and shape, and may be non-circular if desired. Since the package 10 is designed for vertical stacking, the metal cover 18 likewise includes a pair of fluid passages 52 and 54 having the same size and orientation as the fluid passages 48 and 50, respectively.

Figure 2A:
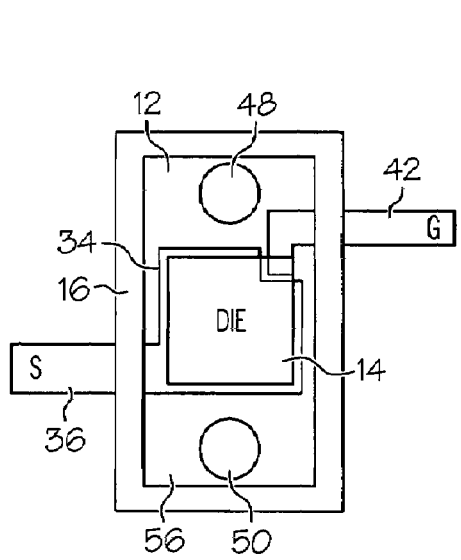
FIG. 2A is a top view diagram of conceptual transistor package based on the package of FIG. 1 according to a first embodiment of this invention, but with the cover of the package removed.
Figure 2B:
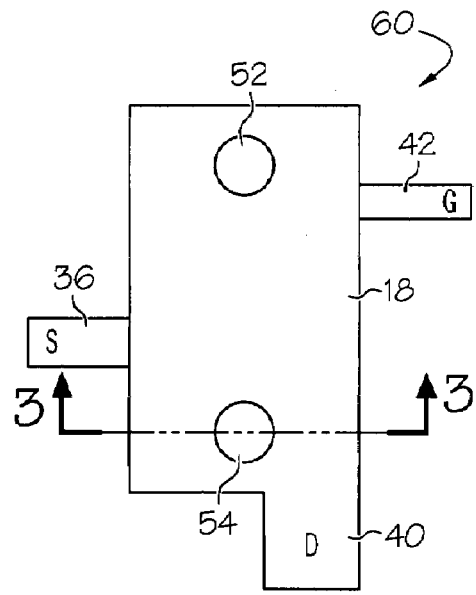
FIG. 2B is a simplified top view diagram of the transistor package of FIG. 2A, with the cover attached.
Figure 3:
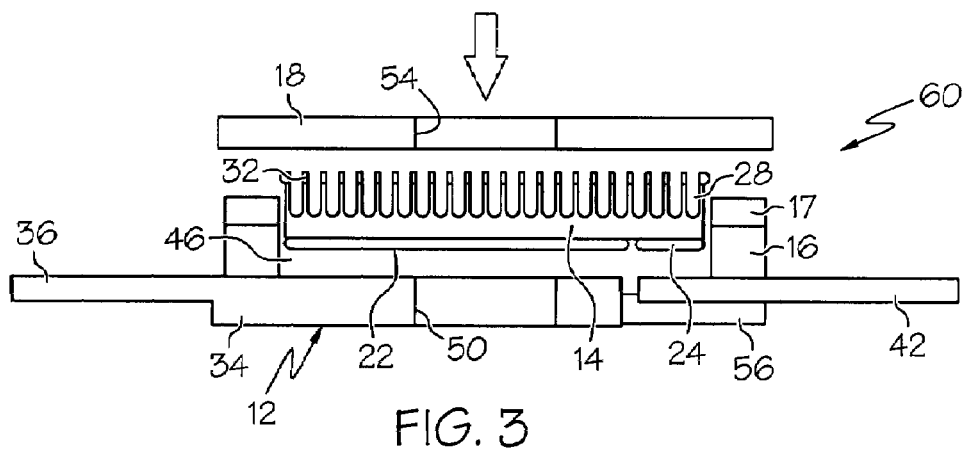
FIG. 3 is an exploded cross-sectional diagram of the transistor package of FIGS. 2A-2B, taken along lines 3-3 in FIG. 2B.

FIGS. 2A-2B and 3 depict a conceptual version of a liquid cooled power transistor package 60 generally corresponding to the package 10 of FIG. 1. Accordingly, the reference numerals used in FIG. 1 are used to designate corresponding elements in FIGS. 2A-2B and 3. One notable difference between the packages 10 and 60 resides in the construction of the base 12. In the package 60, the base 12 is largely plastic 56 molded around the FET mounting platform 34. In this configuration, the metal tab 36 (i.e., the source lead of the package 60) is a lateral extension of the mounting platform 34, as best seen in FIGS. 2A and 3. Also, FIG. 3 shows a metal layer 17 atop frame 16, the cover 18 being peripherally soldered to layer 17 to seal the package 60. Alternately, of course, cover 18 may be secured to frame 16 with conductive adhesive.

The primary significance of the present invention resides in the recognition that a properly designed liquid cooled semiconductor package such as the package 60 of FIGS. 2A-2B and 3 can be used as a building block of a power electronic circuit by replicating and vertically stacking the packages. The vertically stacked packages have electrical interconnects between adjacent packages (by solder or conductive adhesive), and vertically aligned fluid passages at each end for coolant flow between the packages. A number of different circuit configurations are possible because re-orientation of the package prior to stacking changes the electrical interconnects between adjacent packages without disturbing the vertical alignment of the fluid passages. It should be understood that other package configurations are possible. By way of example, the package 60 can be manufactured so that its gate lead 42 is not electrically isolated from the bottom of the package; in this case, the outline of the package is altered so that when the packages are vertically stacked with vertical alignment of their fluid passages, the gate lead of each package is electrically isolated from the adjacent package. It is also possible to mount more than one channeled semiconductor chip on the mounting platform 34 so that the liquid coolant flows through the channels of both chips. This can be particularly advantageous, for example, when a free-wheeling diode is required to be connected in parallel with the drain-to-source circuit of FET 14.

FIGS. 4A-4E illustrate how a set of four transistor packages like the package 60 of FIGS. 2A-2B and 3 can be vertically stacked to form a liquid cooled semiconductor power circuit. FIG. 4A depicts a first package 60a in the base orientation, FIG. 4B depicts a second package 60b in a flipped orientation, FIG. 4C depicts a third package 60c in a rotated orientation, and FIG. 4D depicts a fourth package in a flipped and rotated orientation. The letters a, b, c and d are appended to the reference numerals designating the elements of packages 60a, 60b, 60c and 60d, respectively.

Horizontal and vertical axes of symmetry for package re-orientation are shown on the package 60a of FIG. 4A. The horizontal axis of symmetry is designated by a horizontal line 62 drawn such that any point on line 62 is equidistant from the centers of the fluid passages 52 and 54 (or 48 and 50). The vertical axis of symmetry is designated by the dot 64 on horizontal axis 62 in the center of package 60a.

The second package 60b of FIG. 4B is re-oriented relative to package 60a by flipping it end-for-end about the horizontal axis 62. When the re-oriented package 60b of FIG. 4B is vertically stacked atop the package 60a of FIG. 4A, the fluid passages on the ends of the packages will be vertically aligned for fluid flow between the packages 60a and 60b. However, the source, drain and gate leads 36, 40 and 42 of the upper package 60b will be laterally mis-aligned with the corresponding leads of the lower package 60a due to the flipped orientation. Thus, the fluid passages 48-54 are symmetrically disposed about horizontal axis 62, but the electrical leads 36, 40 and 42 are asymmetrically disposed about axis 62. From an electrical standpoint, stacking the package 60b atop the package 60a in this way interconnects the cover 18 (drain) of package 60a with the cover (drain) of package 60b.

The third package 60c of FIG. 4C is re-oriented relative to package 60a by rotating it 180° about the vertical axis of symmetry 64. When the re-oriented package 60c is vertically stacked atop the packages 60a or 60b, the fluid passages on the ends of the packages will be vertically aligned for fluid flow between the stacked packages. And the source, drain and gate leads 36, 40 and 42 of the upper package 60c will be laterally mis-aligned with the corresponding leads of the lower package(s) due to the rotated orientation. From an electrical standpoint, stacking the package 60c atop the package 60b in this way interconnects the mounting platform 34 (source) of package 60c with the mounting platform 34 (source) of package 60b. On the other hand, if package 60c were stacked atop package 60a, the mounting platform 34 (source) of package 60c would connect to the cover 18 (drain) of package 60a.

The fourth package 60d of FIG. 4D is re-oriented relative to package 60a by both flipping it end-for-end about the horizontal axis 62 and rotating it 180° about the vertical axis of symmetry 64. When the re-oriented package 60d is vertically stacked atop the packages 60a, 60b or 60c, the fluid passages on the ends of the packages will be vertically aligned for fluid flow between the stacked packages. And as with the other examples, the source, drain and gate leads 36, 40 and 42 of the upper package 60d will be laterally mis-aligned with the corresponding leads of the lower package(s). From an electrical standpoint, stacking the package 60d atop the packages 60a or 60c interconnects the covers (drains) of the two packages. On the other hand, stacking package 60d atop package 60b interconnects the cover 18 (drain) of package 60d with the mounting platform 34 (source) of package 60b.

FIG. 4E depicts a vertically stacked assembly 66 of the packages 60a-60d. It is significant to note that the fluid passages on the ends of the packages 60a-60d are vertically aligned, and that source, drain and gate leads of the various packages 60a-60d are vertically mis-aligned. Since the fluid passages are vertically aligned at each end of the stacked assembly 66, coolant liquid can be supplied to all of the packages 60a-60d at one end of the assembly 66, and exhausted from all of the packages 60a-60d at the other end of the assembly 66. A plate (not shown) may be added to the top of the assembly 66 to seal off the exposed fluid passages in cover 18a, or the unwanted fluid passages may be omitted from cover 18a during its manufacture. Since the source, drain and gate leads of the various packages 60a-60d are vertically mis-aligned, they can be bent downward without interference to facilitate mounting of the assembly 66 on a circuit board.

Figure 5A:
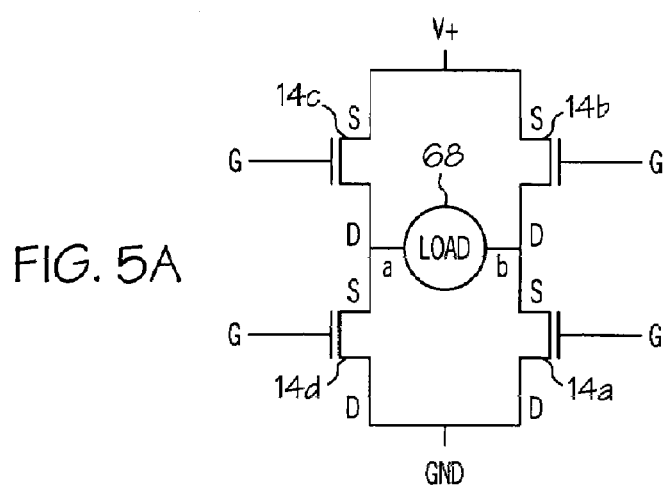
FIG. 5A depicts an H-Bridge transistor circuit.
Figure 5B:
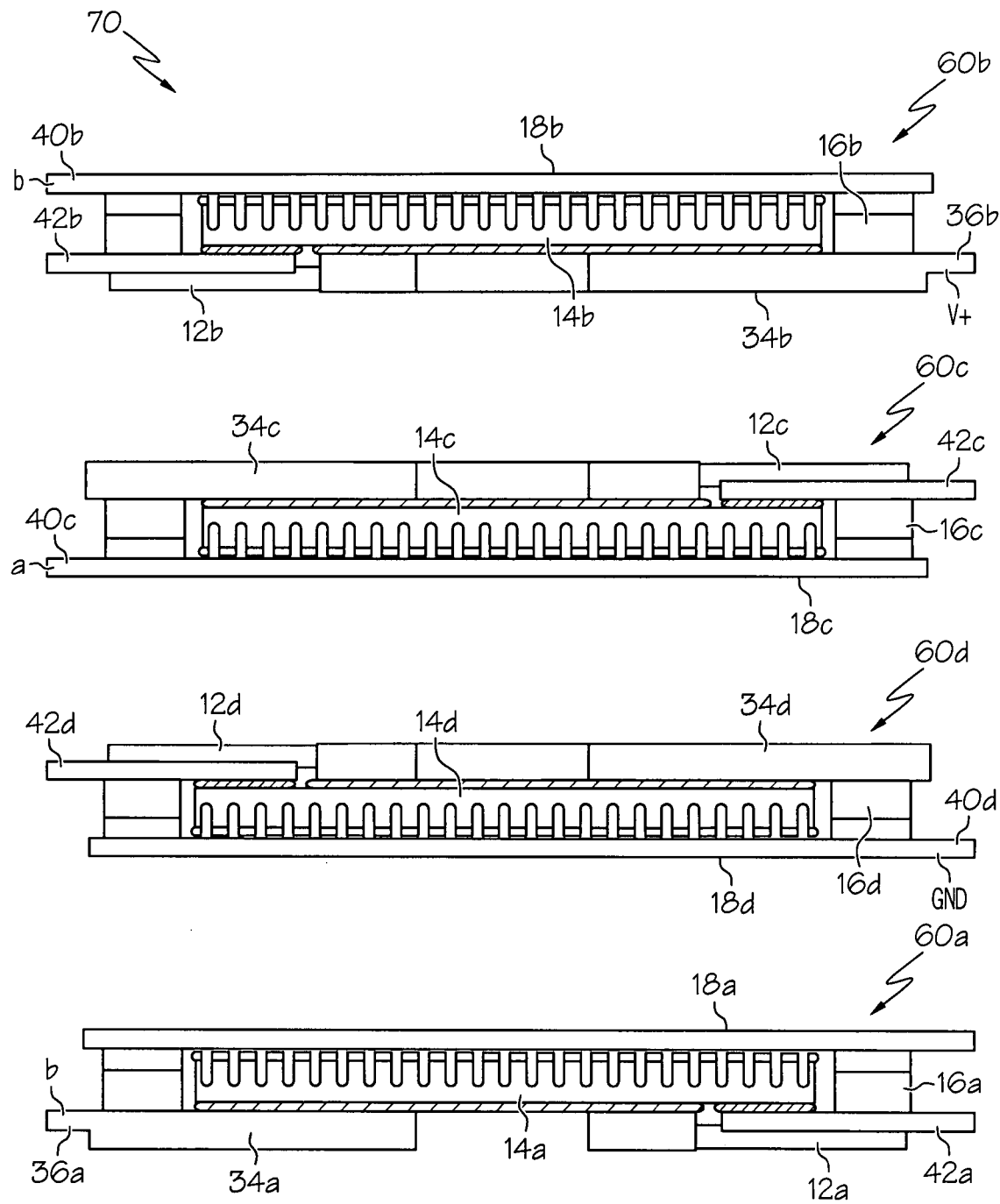
FIG. 5B is an exploded cross-sectional view of an assembly formed by vertically stacking the liquid cooled transistor packages of FIGS. 4A-4D for effectuating the circuit of FIG. 5A.

FIGS. 5A and 5B respectively illustrate an H-Bridge transistor circuit and a corresponding assembly 70 of vertically stacked liquid cooled transistor packages 60a-60d. Referring to FIG. 5A, the reference numeral 68 designates a two-terminal (a and b) electrical load such as a DC motor. The FETs 14b and 14a respectively couple load terminal b to power (V+) and ground (GND); and the FETs 14c and 14d respectively couple load terminal a to power (V+) and ground (GND). The source, drain and gate terminals of each FET 14a-14d are designated by the letters S, D and G, respectively. In operation, load current in a first direction (a-to-b) is established by turning on FETs 14a and 14c with FETs 14b and 14d turned off; and load current in the opposite direction (b-to-a) is established by turning on FETs 14b and 14d with FETs 14a and 14c turned off.

FIG. 5B depicts a vertically stacked assembly 70 of four liquid cooled transistor packages 60a-60d respectively corresponding to the FETs 14a-14d of FIG. 5A. As in FIGS. 4A-4E, the letters a-d are appended to the reference numerals to distinguish like elements of different packages. When the packages 60a-60d are assembled, of course, the juxtaposed terminals of adjoining packages are soldered together; i.e., the mounting plate 34b (source) of package 60b is soldered to the mounting plate 34c (source) of package 60c, and so on. Also, the cover 18b of the top package 60b is formed without fluid passages to seal the top of the assembly 70. It will be observed that the packages 60a-60d are oriented in the same way as depicted in FIGS. 4A-4D, and then vertically stacked in the indicated order.

It can be demonstrated that the assembly 70 effectuates the H-Bridge circuit of FIG. 5A. Starting at the top of the assembly 70, the mounting plates 34b and 34c (sources) of packages 60b and 60c are joined and the source lead 36b is coupled to V+. The drain lead 40b of package 60b is coupled to load terminal b, and the drain lead 40c of package 60c is coupled to load terminal a. The cover 18c (drain) of package 60c is soldered to the mounting plate 34d (source) of package 60d to couple the source of FET 14d to load terminal a. The covers 18d and 18a (drains) of packages 60d and 60a are joined, and the drain lead 40d is coupled to ground GND. Finally, the source lead 36a of package 60a is coupled to load terminal b.

Figure 6B:
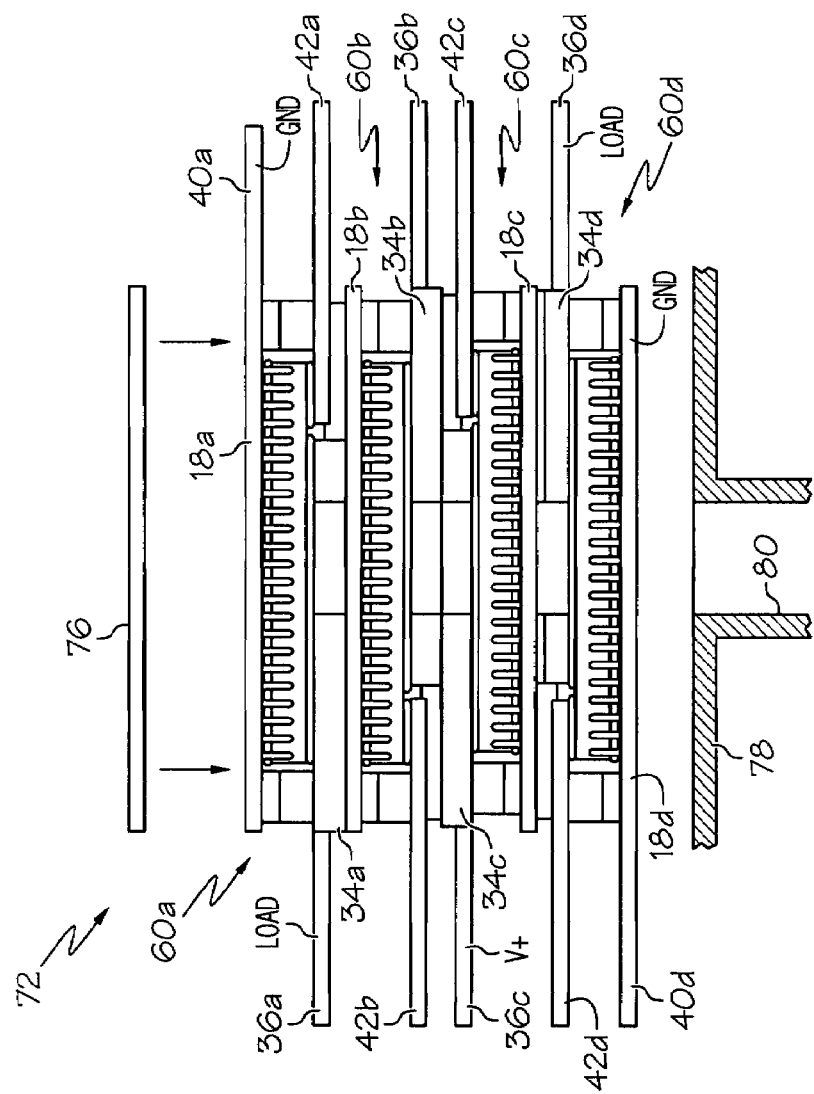
FIG. 6B is a partially exploded cross-sectional view of an assembly formed by vertically stacking the liquid cooled transistor packages of FIGS. 4A-4D for effectuating the circuit of FIG. 6A.
Figure 6A:
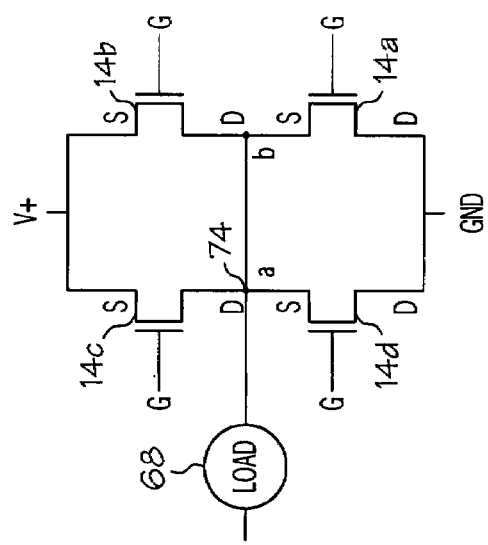
FIG. 6A depicts a ½-H-Bridge transistor circuit.
Figure 7B:
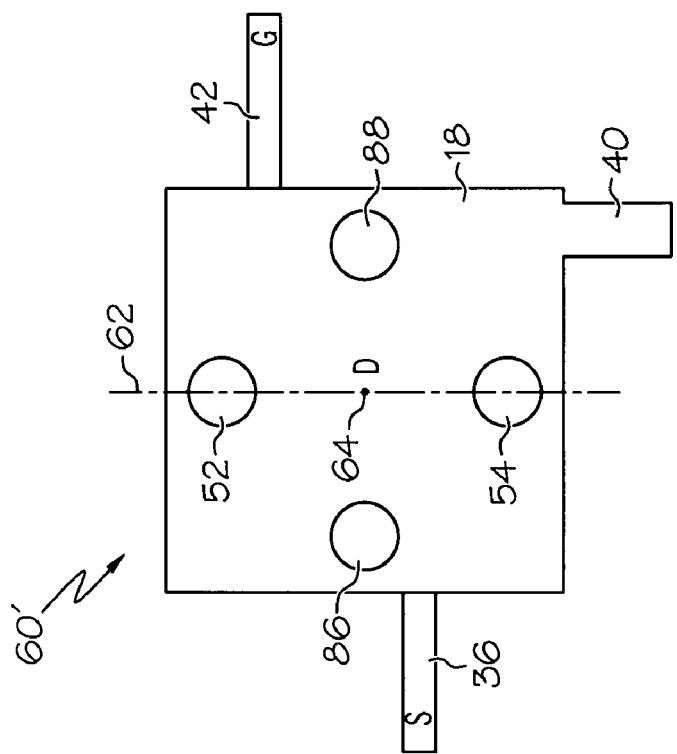
FIG. 7B is a simplified top view diagram of the transistor package of FIG. 7A, with the cover attached.
Figure 7A:
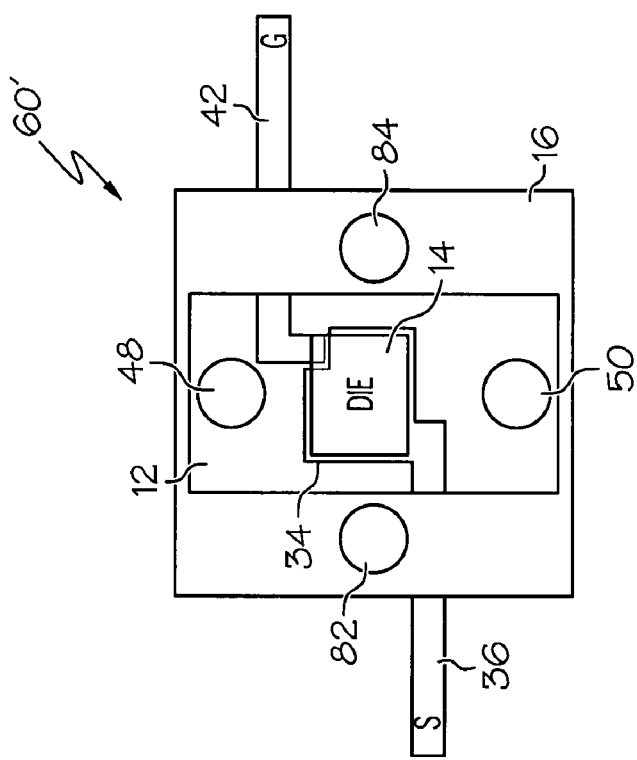
FIG. 7A is a top view diagram of conceptual transistor package based on the package of FIG. 1 according to a second embodiment of this invention, but with the cover of the package removed.

FIGS. 6A and 6B respectively illustrate a ½-H-Bridge transistor circuit and a corresponding assembly 72 of vertically stacked liquid cooled transistor packages 60a-60d. Referring to FIG. 6A, the reference numeral 68 designates a two-terminal electrical load such as a DC motor, one terminal of which is coupled to node 74 of the bridge circuit. The FETs 14b and 14c are connected in parallel, and couple the node 74 to power (V+). Similarly, the FETs 14a and 14d are connected in parallel, and couple the node 74 to ground (GND). As in FIG. 5A, the source, drain and gate terminals of each FET 14a-14d are designated by the letters S, D and G, respectively. In operation, FETs 14b and 14c are turned on to connect the load terminal to V+; alternately, FETs 14a and 14d are turned on to connect the load terminal to GND.

FIG. 6B depicts a vertically stacked assembly 72 of four liquid cooled transistor packages 60a-60d respectively corresponding to the FETs 14a-14d of FIG. 6A. As in FIG. 5B, the letters a-d are appended to the reference numerals to distinguish like elements of different packages. It will be observed that the packages 60a-60d are oriented in the same way as depicted in FIGS. 4A-4D, and then vertically stacked in the indicated order. The reference numeral 76 designates a cover that is soldered to the cover 18a to seal the top of the assembly 72. The reference numeral 78 designates a metal base attached to the bottom of the stacked assembly 72 including one or more ports 80 that serve as fluid interconnects to the fluid passages of the assembly 72. The assembly 72 and base 78 mount on a circuit board (not shown), with the port(s) 80 extending through circuit board opening(s).

It can be demonstrated that the assembly 72 effectuates the ½-H-Bridge circuit of FIG. 6A. Starting at the top of the assembly 72, the drain lead 40a of package 60a is coupled to GND. The mounting plate 34a (source) of package 60a is joined to the cover 18b (drain) of package 60b, and the source lead 36a is coupled to load 68. The mounting plates 34b and 34c (sources) of packages 60b and 60c are joined and the source lead 36c is coupled to V+. The mounting plate 34d (source) of package 60d is joined to the cover 18c (drain) of package 60c, and the source lead 36d is coupled to load 68. Finally, the cover 18d (drain) of package 60d is coupled to GND by the lead 40d, or alternately, by soldering it to the base 78 and grounding base 78 to the circuit board.

FIGS. 7A-7B illustrate a modified liquid cooled transistor package 60' having twice as many fluid passages as the package 60 of FIGS. 2A-2B and 3. Two additional fluid passages 82 and 84 are formed in the walls of the molded plastic frame 16 as shown in FIG. 7A, and a pair of vertically aligned fluid passages 86 and 88 are formed in the cover 18 as shown in FIG. 7B. In FIG. 7B, horizontal axis of symmetry is designated by a horizontal line 62, and the additional fluid passages 82-88 are symmetrically disposed about the axis 62. As with the package 60, the package 60' may be re-oriented by flipping it end-for-end about the horizontal axis 62. The vertical axis of symmetry is designated by the central dot 64 on horizontal axis 62, and the package 60' may be re-oriented by rotating it about the axis 64. Since package 60' has four fluid openings instead of two, four different orientations can be achieved by rotation instead of two; i.e., the package 60' may be rotated by 90°, 180° or 270° from the base orientation. Combining the flipping and rotating re-orientations, eight different package orientations are possible. This means that eight of the liquid cooled transistor packages 60' may be vertically stacked (instead of four, in the case of the package 60) while retaining vertical alignment of the fluid passages and avoiding vertical overlap of the package leads.

FIG. 7C depicts an assembly 90 of eight differently oriented packages 60', the letters a-h being appended to the reference numerals to distinguish like elements of different packages. The reference numerals 36a-36h designate eight different source leads, the reference numerals 40a-40h designate eight different drain leads, and the reference numerals 42a-42h designate eight different gate leads. Of course, some of the leads may be omitted depending on the circuit configuration. A top cover is omitted to show the vertically aligned fluid passages, which are designated I1, I2, O1 and O2. As with the assembly 66 of FIG. 4E, liquid coolant flowing in through the vertically aligned passages labeled I1 exits through the vertically aligned passages labeled O1. Additionally in the case of the assembly 90, liquid coolant flowing in through the vertically aligned passages labeled I2 exits through the vertically aligned passages labeled O2.

In the above-described embodiments, all of the vertically stacked packages of a given assembly form one power electronic circuit. In cases where it is desired to construct two or more circuits with one vertically stacked assembly of packages, a dielectric interposer sheet (not shown) can be inserted between two adjacent packages of the stacked assembly to electrically isolate the packages above the interposer sheet from the packages below the interposer sheet, so long as the interposer sheet is provided with openings that align with the vertically aligned fluid passages of the assembly. Interposer sheets can also be used to form package leads or transistor-to-transistor interconnects by forming them of metal (or metal on a flexible dielectric layer) and extending them beyond the outline of the packages to which they are attached.

In summary, the present invention provides a cost effective and space-efficient way of forming power electronic circuits with direct die liquid cooling. While described in reference to the illustrated embodiments, it is expected that numerous modifications and variations in addition to those mentioned herein will occur to those skilled in the art. For example, the layout and profile of the semiconductor chip channels may be different than shown, the number and/or shape of the fluid passages, as well as the number of electrical interconnects per package, may be different than shown, and so on. Accordingly, it is intended that the invention not be limited to the disclosed embodiment, but that it have the full scope permitted by the language of the following claims.

The invention claimed is:

1. A liquid cooled power electronic circuit, comprising:
a vertically stacked assembly of liquid cooled semiconductor packages configured for inter-package flow of liquid coolant through the semiconductor packages of said assembly, where each semiconductor package includes a semiconductor chip and a pair of conductive plates that cooperate to enclose the semiconductor chip and that contact terminals of said semiconductor chip, and where juxtaposed plates of said vertically stacked semiconductor packages are electrically joined to provide electrical interconnects between the semiconductor chips enclosed in adjacent packages of said vertically stacked assembly and thereby define one or more power electronic circuits.

2. The liquid cooled power electronic circuit of claim 1, where:
said packages include a fluid chamber vertically bounded by a first plate and a second plate, with the semiconductor chip mounted in the fluid chamber, a first set of vertically oriented fluid passages formed in said first plate for receiving and exhausting liquid coolant, and a second set of vertically oriented fluid passages formed in said second plate that are vertically aligned with the first set of fluid passages for allowing the inter-package flow of liquid coolant when the packages are vertically stacked.

3. The liquid cooled power electronic circuit of claim 1, where:
the fluid passages of a given package are symmetrically disposed about a horizontal axis, and selected packages of said assembly are flipped about said horizontal axis prior to assembly to thereby change the electrical interconnects between the selected packages and any adjacent packages of said vertically stacked assembly while preserving the inter-package flow of liquid coolant through said assembly.

4. The liquid cooled power electronic circuit of claim 3, where:
said semiconductor packages each include laterally extending electrical leads that are asymmetrically disposed about said horizontal axis such that the leads of the selected packages are vertically misaligned with the leads of the other packages of the assembly.

5. The liquid cooled power electronic circuit of claim 1, where:
said semiconductor packages each include laterally extending electrical leads;
the fluid passages of a given package are symmetrically disposed about a vertical axis; and
selected packages of said assembly are rotated about said vertical axis prior to assembly to thereby change a location of the electrical leads for such packages while preserving the inter-package flow of liquid coolant through said assembly.

6. The liquid cooled power electronic circuit of claim 1, where said liquid cooled semiconductor packages each comprise:
an insulative frame vertically bounded by a first plate and a second plate to define a fluid chamber where said semiconductor chip is disposed in the fluid chamber; and
the terminals of said semiconductor chip are coupled to said first and second plates by solder or conductive adhesive to electrically and mechanically tie said semiconductor chip to said semiconductor package.

7. The liquid cooled power electronic circuit of claim 6, where:
lateral extensions of said first and second plates form electrical leads of said package.

8. The liquid cooled power electronic circuit of claim 6, where:
said insulative frame is molded onto said first plate.

9. The liquid cooled power electronic circuit of claim 6, where:
said insulative frame is formed of ceramic with metalized surfaces for attachment to said first and second plates by solder or conductive adhesive.

10. The liquid cooled power electronic circuit of claim 1, where:
said semiconductor chip is a transistor, and the power electronic circuit is an H-Bridge or a ½-H-Bridge.

11. The liquid cooled power electronic circuit of claim 6, further comprising:
fluid inlet and outlet passages formed in opposite ends of said first plate within said insulative frame for admitting and exhausting liquid coolant, said semiconductor chip having a major face that is mounted on said first plate and undercut to form fluid conducting channels that conduct the liquid coolant from said inlet passage to said outlet passage.

12. The liquid cooled power electronic circuit of claim 1, where:
said juxtaposed plates are mechanically and electrically joined by solder or conductive adhesive.

* * * * *